US011502033B2

(12) United States Patent
Yang

(10) Patent No.: US 11,502,033 B2
(45) Date of Patent: Nov. 15, 2022

(54) SEMICONDUCTOR DEVICES INCLUDING CONTACTS AND CONDUCTIVE LINE INTERFACES WITH CONTACTING SIDEWALLS

(71) Applicant: SAMSUNG ELECTRONICS CO., LTD., Suwon-si (KR)

(72) Inventor: Kiho Yang, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 67 days.

(21) Appl. No.: 17/172,292

(22) Filed: Feb. 10, 2021

(65) Prior Publication Data

US 2021/0167010 A1 Jun. 3, 2021

Related U.S. Application Data

(62) Division of application No. 16/385,373, filed on Apr. 16, 2019, now Pat. No. 10,937,732.

(30) Foreign Application Priority Data

Sep. 11, 2018 (KR) .................. 10-2018-0108392

(51) Int. Cl.
  *H01L 23/522* (2006.01)
  *H01L 23/528* (2006.01)
  *H01L 23/532* (2006.01)
(52) U.S. Cl.
  CPC ...... *H01L 23/5226* (2013.01); *H01L 23/5283* (2013.01); *H01L 23/53223* (2013.01); *H01L 23/53238* (2013.01)

(58) Field of Classification Search
  CPC .................................................. H01L 23/5226
  See application file for complete search history.

(56) References Cited

U.S. PATENT DOCUMENTS

| 6,502,441 | B1 | 1/2003 | Suzuki et al. |
| 9,064,731 | B2 | 6/2015 | Park |
| 9,337,105 | B1 | 5/2016 | Kwon et al. |
| 9,437,540 | B2 | 9/2016 | Lin et al. |
| 9,786,550 | B2 | 10/2017 | Gates et al. |

(Continued)

FOREIGN PATENT DOCUMENTS

| EP | 1 095 735 A1 | 5/2001 |
| EP | 2 198 099 B1 | 2/2011 |

(Continued)

*Primary Examiner* — Moazzam Hossain
(74) *Attorney, Agent, or Firm* — Sughrue Mion, PLLC

(57) ABSTRACT

Disclosed is a semiconductor device comprising a substrate, a first dielectric layer and a second dielectric layer that are sequentially stacked on the substrate, a contact that penetrates the first dielectric layer and extends toward the substrate, and a conductive line that is provided in the second dielectric layer and electrically connected to the contact, The conductive line extends in a first direction. The contact comprises a lower segment in the first dielectric layer and an upper segment in the second dielectric layer. A width in a second direction of the conductive line decreases with decreasing distance from the substrate. The second direction intersects the first direction. A sidewall of the upper segment of the contact is in contact with the conductive line.

11 Claims, 15 Drawing Sheets

(56) References Cited

U.S. PATENT DOCUMENTS

| | | | |
|---|---|---|---|
| 2008/0026564 A1* | 1/2008 | Frohberg | H01L 21/76816 |
| | | | 438/637 |
| 2010/0295188 A1 | 11/2010 | Han | |
| 2011/0006360 A1 | 1/2011 | Ikebuchi | |
| 2015/0094803 A1 | 4/2015 | Navia | |
| 2016/0163587 A1* | 6/2016 | Backes | H01L 23/53238 |
| | | | 257/751 |
| 2018/0012835 A1 | 1/2018 | Kim | |
| 2018/0033727 A1 | 2/2018 | Lee | |
| 2019/0148287 A1 | 5/2019 | Chang | |
| 2019/0164887 A1 | 5/2019 | Wang | |
| 2020/0006230 A1 | 1/2020 | Tsai | |
| 2020/0161231 A1 | 5/2020 | Lee | |

FOREIGN PATENT DOCUMENTS

| | | |
|---|---|---|
| EP | 3 052 052 B1 | 1/2018 |
| KR | 10-0470164 B1 | 4/2005 |
| KR | 10-2014-0131776 A | 11/2014 |
| KR | 10-2016-0066876 A | 6/2016 |

* cited by examiner

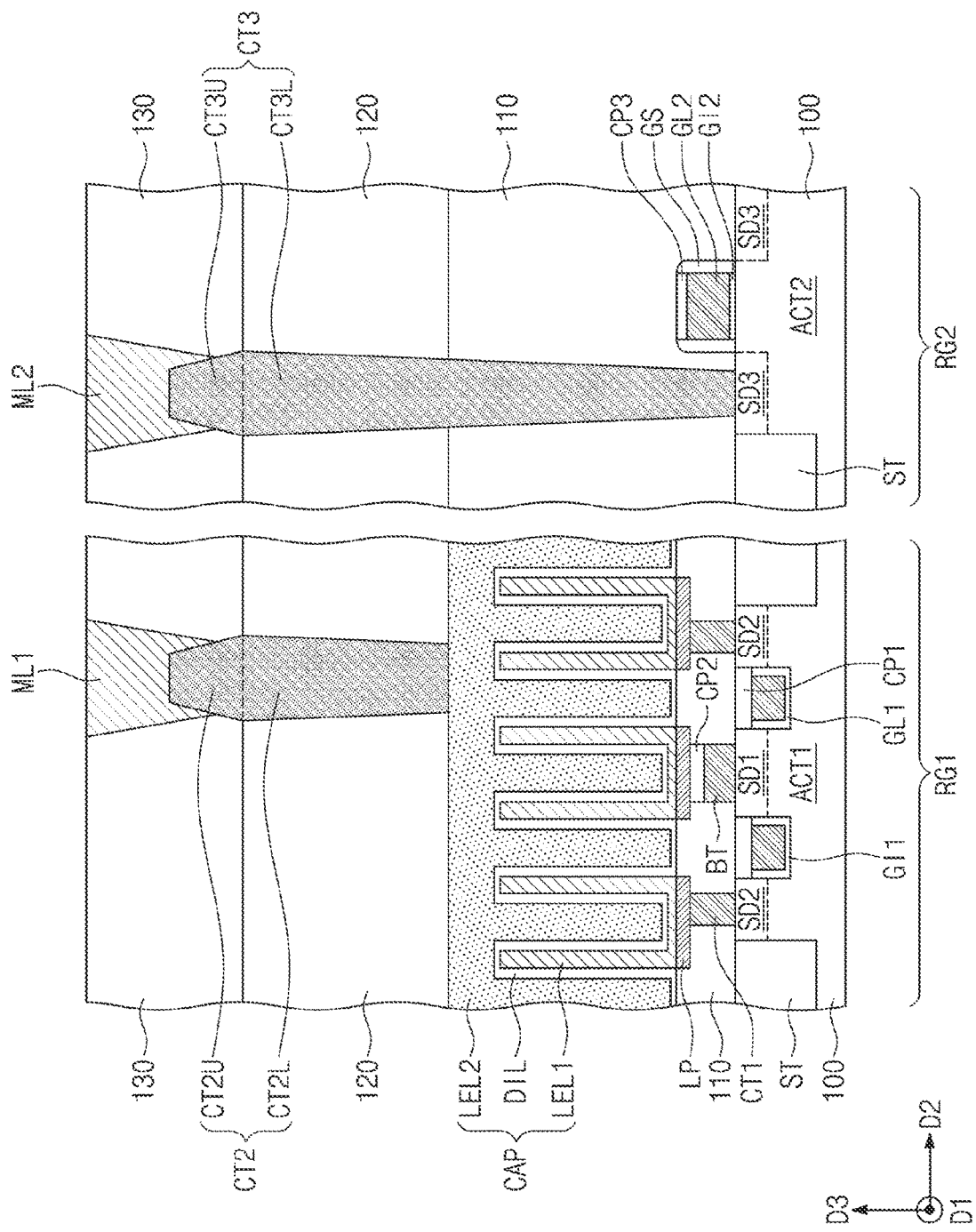

SEMICONDUCTOR DEVICES INCLUDING CONTACTS AND CONDUCTIVE LINE INTERFACES WITH CONTACTING SIDEWALLS

CROSS-REFERENCE TO RELATED APPLICATION

This application is a Divisional of U.S. patent application Ser. No. 16/385,373 filed on Apr. 16, 2019, which claims priority under 35 U.S.C § 119 to Korean Patent Application No. 10-2018-0108392 filed on Sep. 11, 2018 in the Korean Intellectual Property Office, the entire contents of which are hereby incorporated by reference.

BACKGROUND

The present inventive concepts relate to interconnect structures in semiconductor devices.

Semiconductor devices are widely used in the electronic industry because of their small size, multi-functionality, and/or low manufacturing cost. Semiconductor devices may encompass a memory device for storing data, a logic device for processing data, and a hybrid device for operating various functions simultaneously.

Semiconductor devices have been increasingly used for high integration with the advanced development of the electronic industry. It therefore is increasingly difficult to manufacture semiconductor devices because there is a problem of process margin reduction in an exposure process defining fine patterns. Semiconductor devices also have been increasingly used for high speed with the advanced development of the electronic industry. Various studies have been proposed to meet the requirements of high integration and/or high speed in semiconductor devices.

SUMMARY

Embodiments according to the inventive concepts can provide semiconductor devices including contacts and conductive line interfaces with contacting sidewalls. Pursuant to these embodiments, a semiconductor device can include a substrate and a first dielectric layer and a second dielectric layer that are sequentially stacked on the substrate. A contact can penetrate the first dielectric layer and extend toward the substrate, the contact can include a lower segment in the first dielectric layer and an upper segment in the second dielectric layer. A conductive line can extend in a first direction in the second dielectric layer and electrically connected to the contact. A sidewall of the upper segment of the contact is in contact with the conductive line.

According to some example embodiments of the present inventive concepts, a semiconductor device can include a substrate and a first dielectric layer and a second dielectric layer that are sequentially stacked on the substrate. A contact can penetrate the first dielectric layer and extend toward the substrate. A conductive line can be provided in the second dielectric layer and electrically connected to the contact, where the conductive line extending in a first direction, wherein the contact can include a lower segment in the first dielectric layer and an upper segment in the second dielectric layer, wherein a width of the upper segment of the contact in a second direction increases with decreasing distance from the substrate, the second direction intersecting the first direction, and wherein a width of the conductive line in the second direction decreases with decreasing distance from the substrate.

According to some example embodiments of the present inventive concepts, a semiconductor device can include a first dielectric layer and a second dielectric layer that are sequentially stacked on the substrate and a contact that penetrates the first dielectric layer and extends toward the substrate. A conductive line can be in the second dielectric layer and electrically connected to the contact, where the conductive line extends in a first direction, wherein the contact comprises a lower segment in the first dielectric layer and an upper segment in the second dielectric layer. The conductive line can include a recess in a lowest surface thereof that is recessed in a direction away from the substrate and the upper segment of the contact is in contact with the recess.

BRIEF DESCRIPTION OF THE DRAWINGS

FIG. 6 illustrates a cross-sectional view showing a semiconductor device according to some example embodiments of the present inventive concepts.

DETAILED DESCRIPTION OF EMBODIMENTS

Figure 1A:
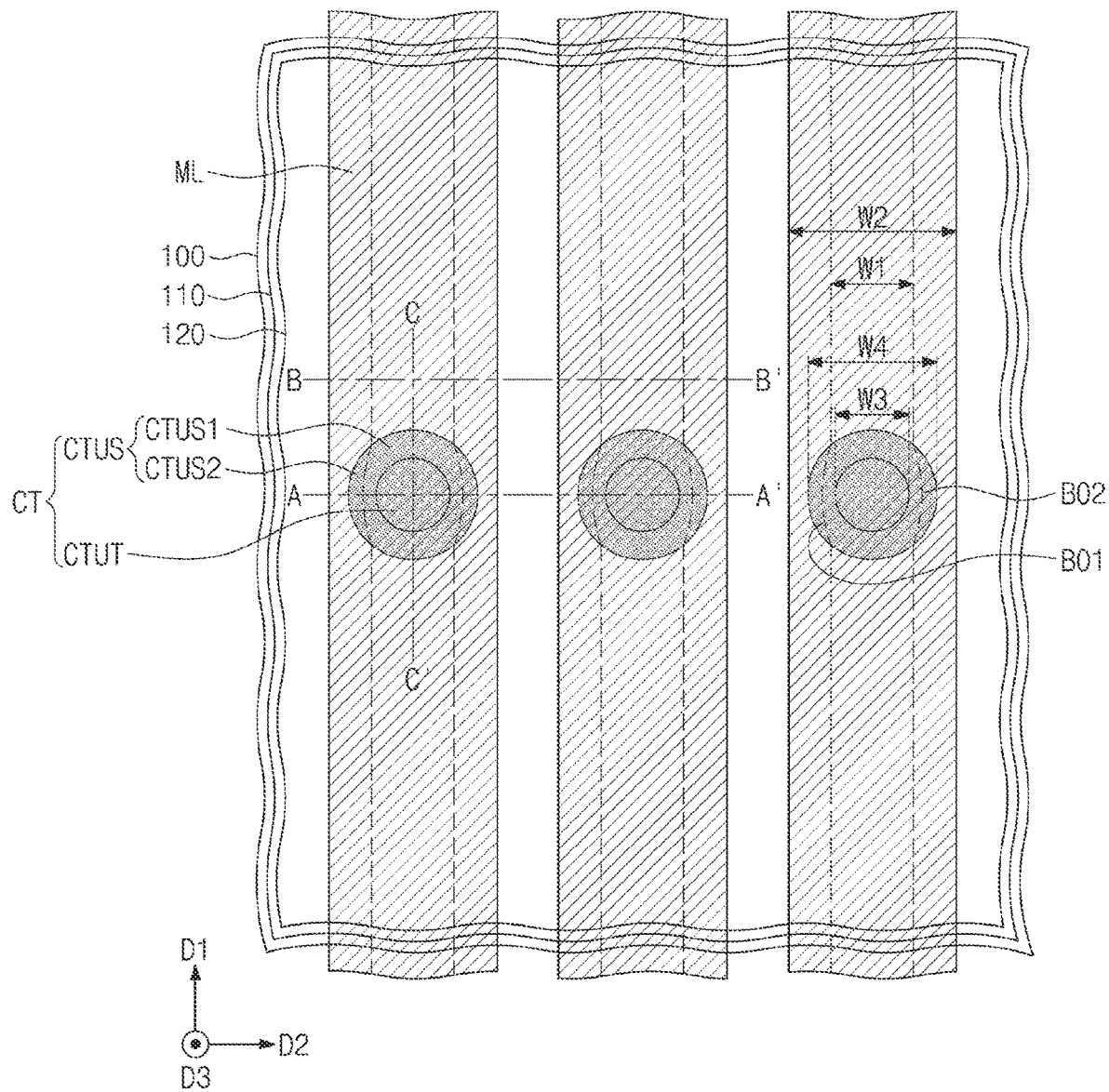
FIG. 1A illustrates a plan view showing a semiconductor device according to some example embodiments of the present inventive concepts.
Figure 1B:
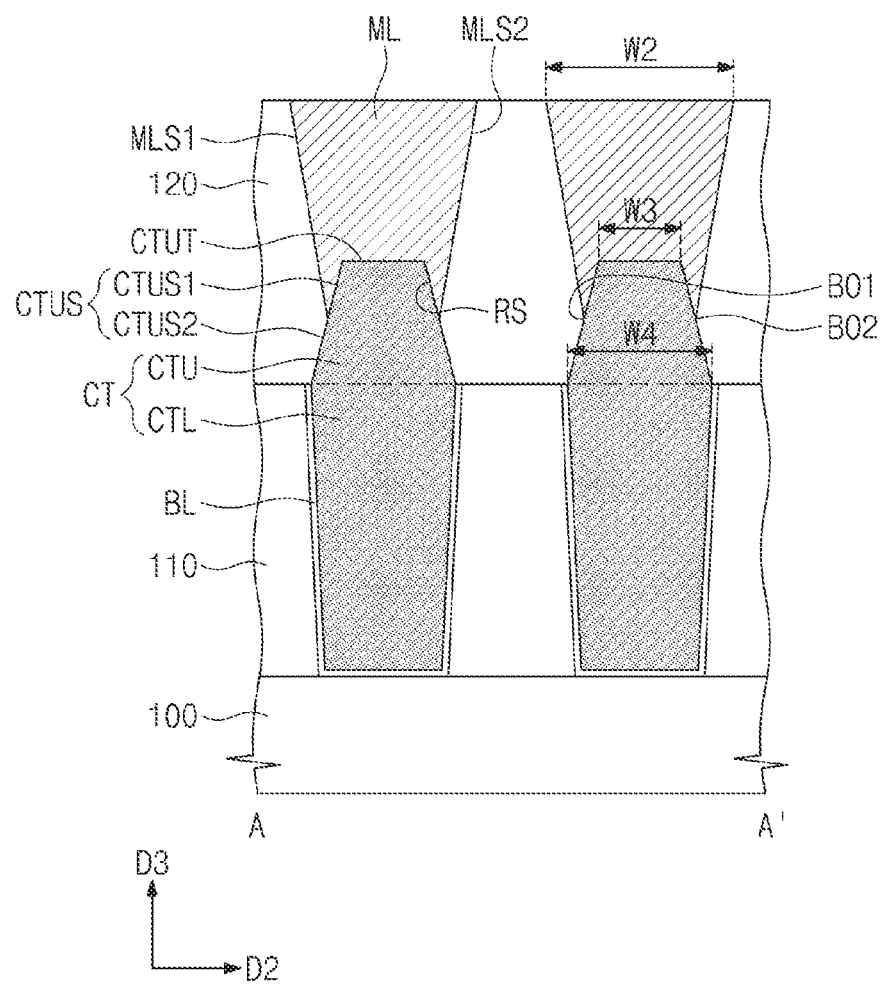
FIG. 1B illustrates a cross-sectional view taken along line A-A' of FIG. 1A.
Figure 1C:
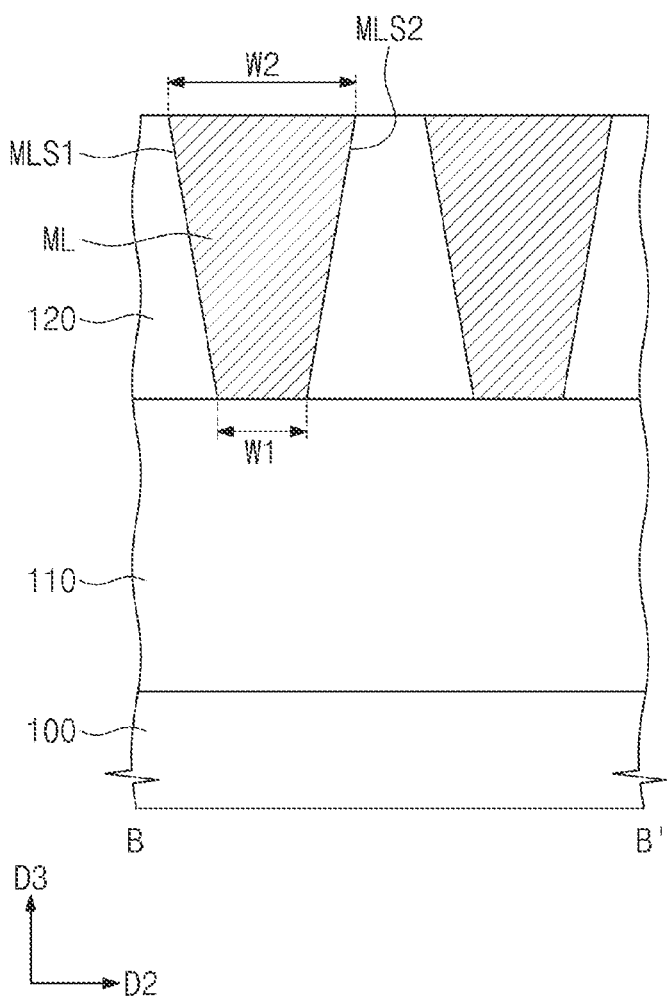
FIG. 1C illustrates a cross-sectional view taken along line B-B' of FIG. 1A.
Figure 1D:
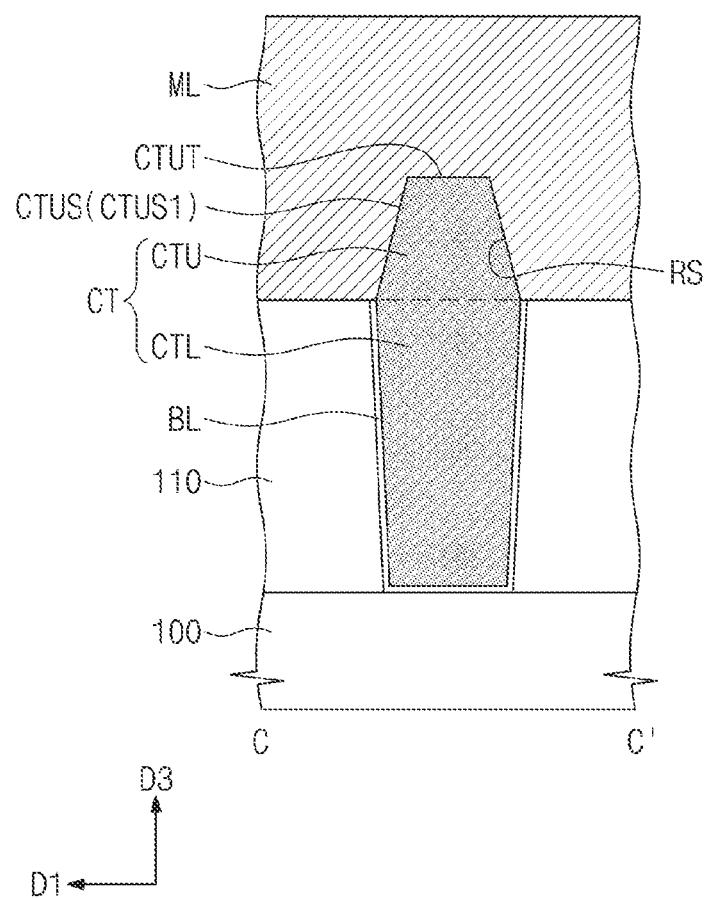
FIG. 1D illustrates a cross-sectional view taken along line C-C' of FIG. 1A.

FIG. 1A illustrates a plan view showing a semiconductor device according to some example embodiments of the present inventive concepts. FIG. 1B illustrates a cross-sectional view taken along line A-A' of FIG. 1A. FIG. 1C illustrates a cross-sectional view taken along line B-B' of FIG. 1A. FIG. 1D illustrates a cross-sectional view taken along line C-C' of FIG. 1A.

Referring to FIGS. 1A, 1B, 1C, and 1D, a first dielectric layer 110 and a second dielectric layer 120 may be sequentially provided on a substrate 100. The substrate 100 may be a semiconductor substrate. For example, the substrate 100 may be a silicon substrate, a germanium substrate, or a silicon-germanium substrate. The substrate 100 may be provided thereon with transistors and/or memory cells. The first dielectric layer 110 may include a silicon oxide layer or a silicon oxynitride layer. The second dielectric layer 120 may include a material having an etch selectivity with respect to the first dielectric layer 110. For example, the second dielectric layer 120 may include tetraethylorthosilicate (TEOS).

Conductive lines ML may be provided on the first dielectric layer 110. The conductive lines ML may be provided in the second dielectric layer 120. Each of the conductive lines ML may have a bar or linear shape extending in a first direction D1. The first direction D1 may be parallel to a top surface of the substrate 100. The conductive lines ML may be spaced apart from each other in a second direction D2. For example, the conductive lines ML may be arranged in the second direction D2. The second direction D2 may be parallel to the top surface of the substrate 100 and may intersect the first direction D1. The conductive lines ML may include copper or aluminum.

Each of the conductive lines ML may include a first sidewall MLS1 and a second sidewall MLS2. The first sidewall MLS1 may stand opposite to the second sidewall MLS2. The first and second sidewalls MLS1 and MLS2 may extend in the first direction D1. Each of the first and second sidewalls MLS1 and MLS2 may have a slope relative to the top surface of the substrate 100. The conductive line ML may have a width in the second direction D2, which width may decrease with decreasing distance from the substrate 100. The conductive line ML may have a minimum width, or a first width W1, in the second direction D2. The conductive line ML may have the first width W1 at the bottom thereof. The conductive line ML may have a maximum width, or a second width W2, in the second direction D2. The conductive line ML may have the second width W2 at the top thereof. The second width W2 may be greater than the first width W1. The conductive line ML may include a recess RS that is recessed toward a direction away from the substrate 100. The recess RS may be provided at a lower portion of the conductive line ML.

The substrate 100 may be provided with contacts CT that electrically connect the conductive lines ML to the substrate 100. The conductive lines ML may be electrically connected through the contacts CT to transistors and/or memory cells on the substrate 100. The contacts CT may penetrate the first dielectric layer 110 and extend in a third direction D3. The contacts CT may extend toward the substrate 100. The third direction D3 may be perpendicular to the top surface of the substrate 100. The contacts CT may include a conductive material. The contacts CT may include a material the same as or different from that of the conductive lines ML. For example, the contacts CT may include metal or doped silicon.

Each of the contacts CT may include a lower segment CTL provided in the first dielectric layer 110 and an upper segment CTU disposed on the lower segment CTL. The upper segment CTU may be provided in the second dielectric layer 120. When viewed in plan, the lower segment CTL may be surrounded by the first dielectric layer 110. When viewed in plan, the upper segment CTU may be surrounded by the second dielectric layer 120. The upper segment CTU may be in contact with the conductive line ML. The upper segment CTU may fill the recess RS of the conductive line ML. The upper segment CTU may have a width in the second direction D2, which width may increase with decreasing distance from the substrate 100. The lower segment CTL may have a width in the second direction D2, which width may decrease with decreasing distance from the substrate 100. The upper segment CTU may have a minimum width, or a third width W3, in the second direction D2. The third width W3 may be less than the first width W1 of the conductive line ML. The upper segment CTU may have a maximum width, or a fourth width W4, in the second direction D2. The fourth width W4 may be greater than the first width W1 of the conductive line ML. The fourth width W4 may be less than the second width W2 of the conductive line ML.

The upper segment CTU of the contact CT may have a top surface CTUT and a third sidewall CTUS. When viewed in plan, the top surface CTUT may have a circular shape. When viewed in plan, the third sidewall CTUS may surround the top surface CTUT. The third sidewall CTUS may be tapered to have a slope relative to the top surface of the substrate 100. The taper of the third sidewall CTUS can be opposite to the taper of the second sidewall MLS1 and MLS2.

The top surface CTUT may be covered with the conductive line ML. For example, the top surface CTUT may be in contact with the conductive line ML.

The third sidewall CTUS may include a first part CTUS1 and a second part CTUS2. The first part CTUS1 may be a portion connected to the top surface CTUT of the contact CT. The second part CTUS2 may be a portion connected to the lower segment CTL of the contact CT. The first part CTUS1 of the third sidewall CTUS may be covered with the conductive line ML. For example, the first part CTUS1 of the third sidewall CTUS may be in contact with the conductive line ML. The second part CTUS2 of the third sidewall CTUS may not be covered with the conductive line ML. For example, the second part CTUS2 of the third sidewall CTUS may not be in contact with the conductive line ML. The second part CTUS2 of the third sidewall CTUS may be covered with the second dielectric layer 120. For example, the second part CTUS2 of the third sidewall CTUS may be in contact with the second dielectric layer 120.

The third sidewall CTUS of the upper segment CTU of the contact CT may be in contact with the first and second sidewalls MLS1 and MLS2 of the conductive line ML. A first boundary BO1 may be defined to refer to a boundary where the third sidewall CTUS is in contact with the first sidewall MLS1. A second boundary BO2 may be defined to refer to a boundary where the third sidewall CTUS is in contact with the second sidewall MLS2. The first sidewall MLS1, the third sidewall CTUS, and the second dielectric layer 120 may be in contact with each other at the first boundary BO1. The second sidewall MLS2, the third sidewall CTUS, and the second dielectric layer 120 may be in contact with each other at the second boundary BO2. The first and second boundaries BO1 and BO2 may be curved when viewed in plan (see FIG. 1A). The first and second boundaries BO1 and BO2 may divide the third sidewall CTUS into the first part CTUS1 and the second part CTUS2. Accordingly, the cross section of the structure shown in FIG. 1B can define an hour glass shape at the boundary of the conductive line ML and the contact CT.

Barrier layers BL may be provided to conformally cover sidewalls and bottom surfaces of the lower segments CTL of the contacts CT. Each of the barrier layers BL may be interposed between the contact CT and the first dielectric layer 110. The barrier layers BL may include titanium nitride.

According to some example embodiments of the present inventive concepts, because the conductive line ML and the contact CT are in contact with each other at the third sidewall CTUS of the upper segment CTU, a relatively large contact area may be provided between the conductive line ML and the contact CT. As a result, it may be possible to improve characteristics of interface resistance between the conductive line ML and the contact CT.

Figure 2A:
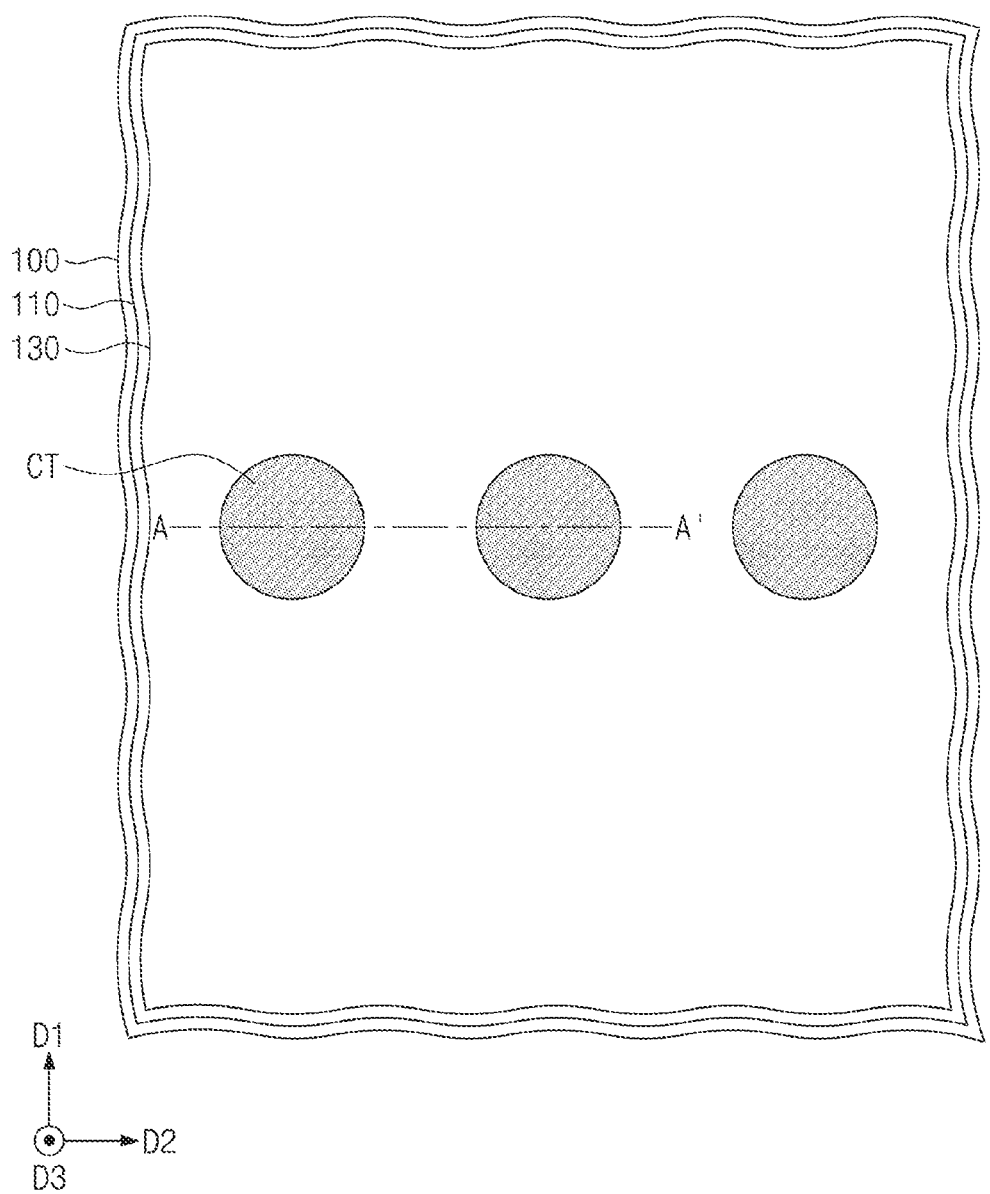
FIGS. 2A, 3A, and 4A illustrate plan views showing a method of fabricating a semiconductor device, according to some example embodiments of the present inventive concepts.
Figure 2B:
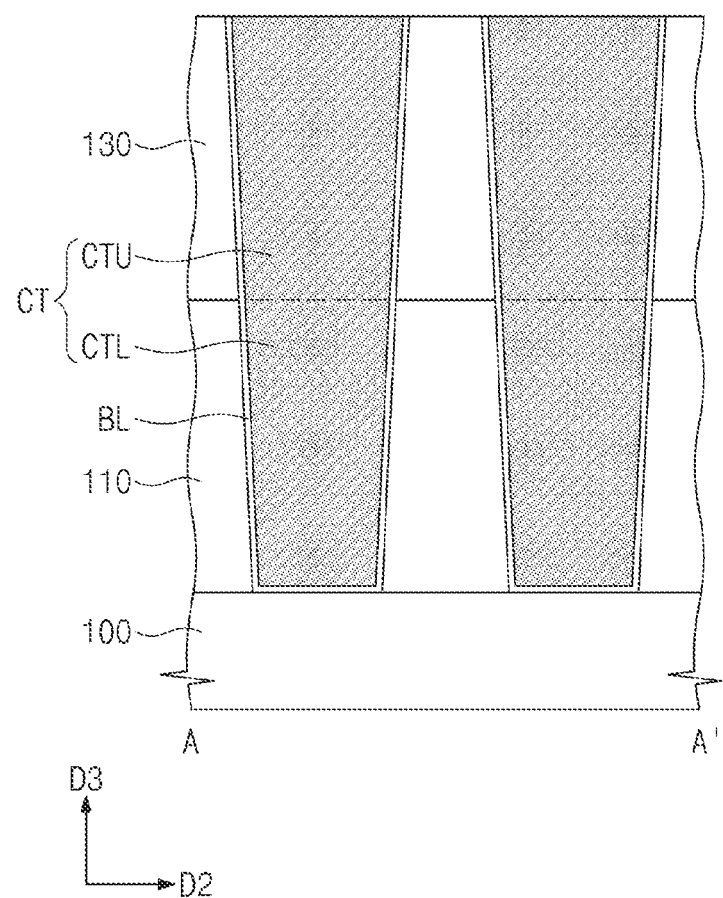
FIGS. 2B, 3B, and 4B illustrate cross-sectional views taken along line A-A' of FIGS. 2A, 3A, and 4A, respectively.
Figure 3A:
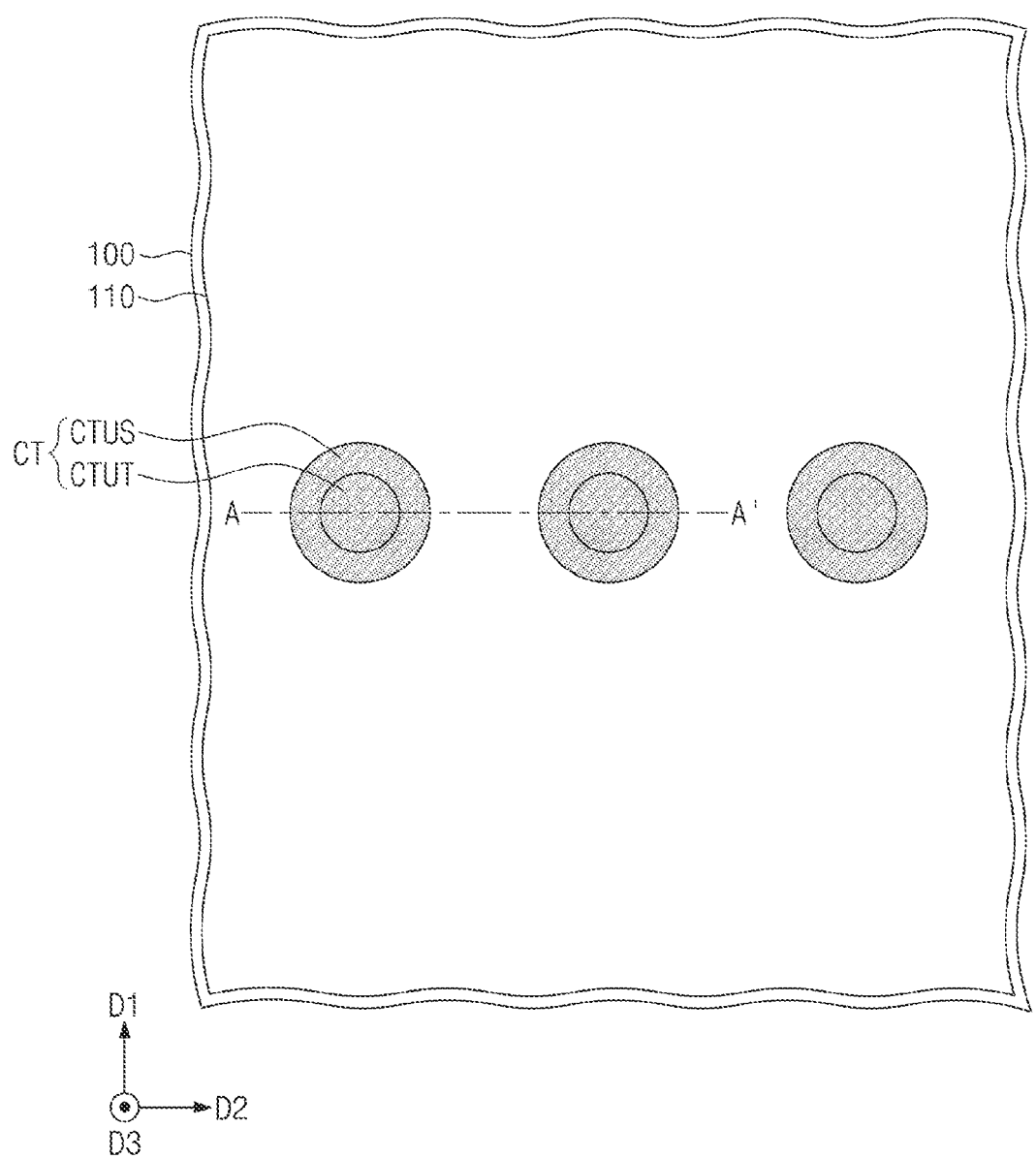
Figure 3B:
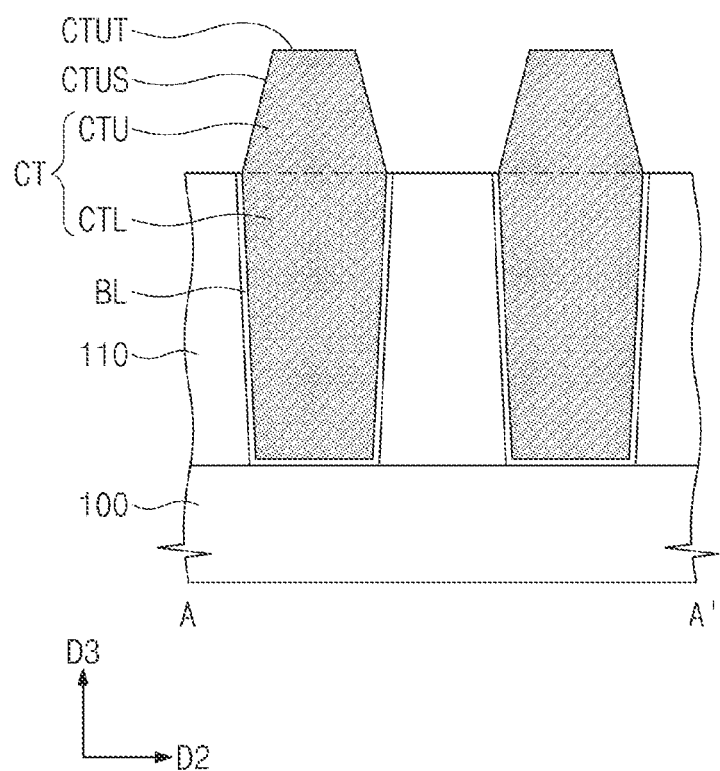
Figure 4A:
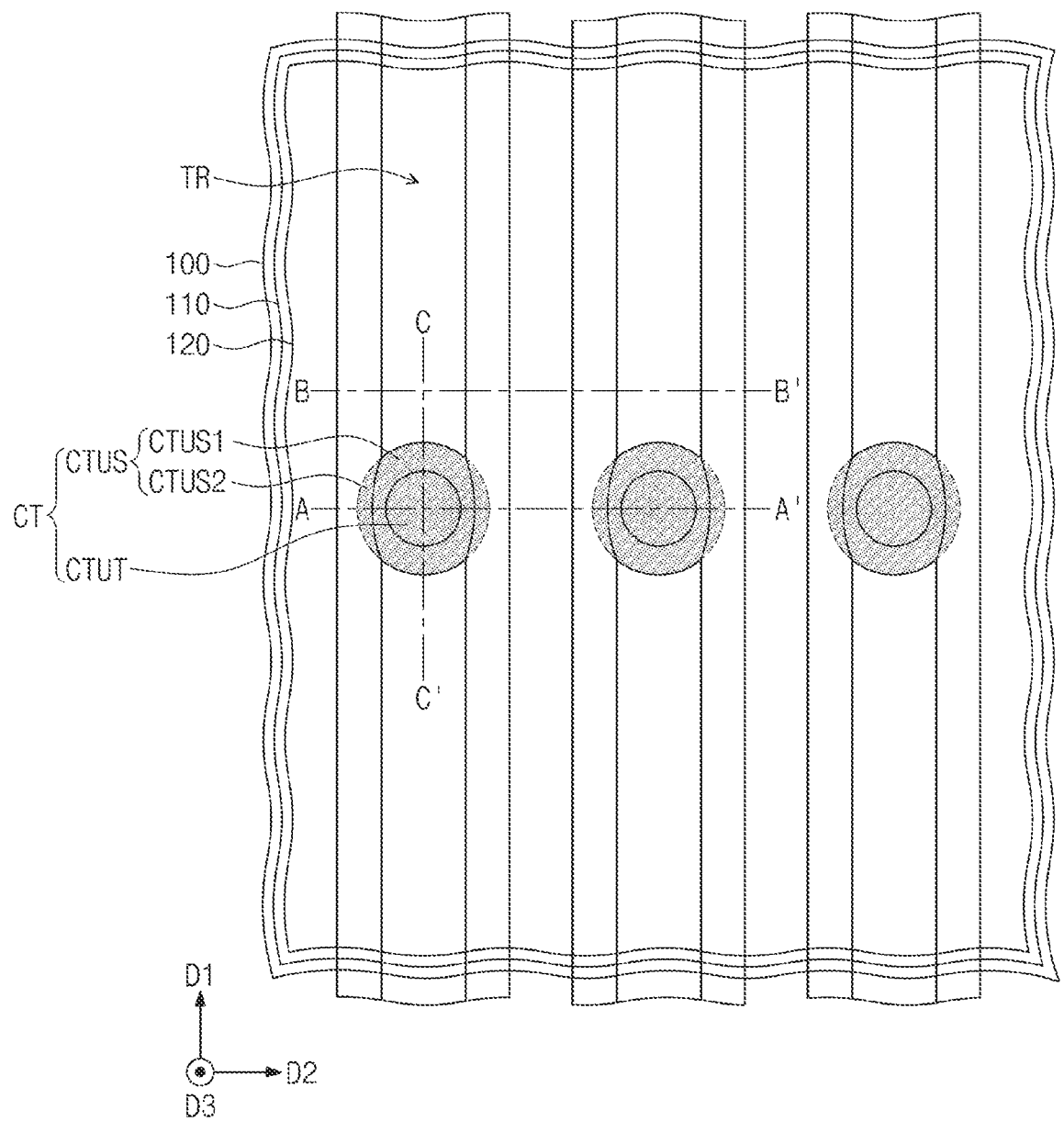
Figure 4B:
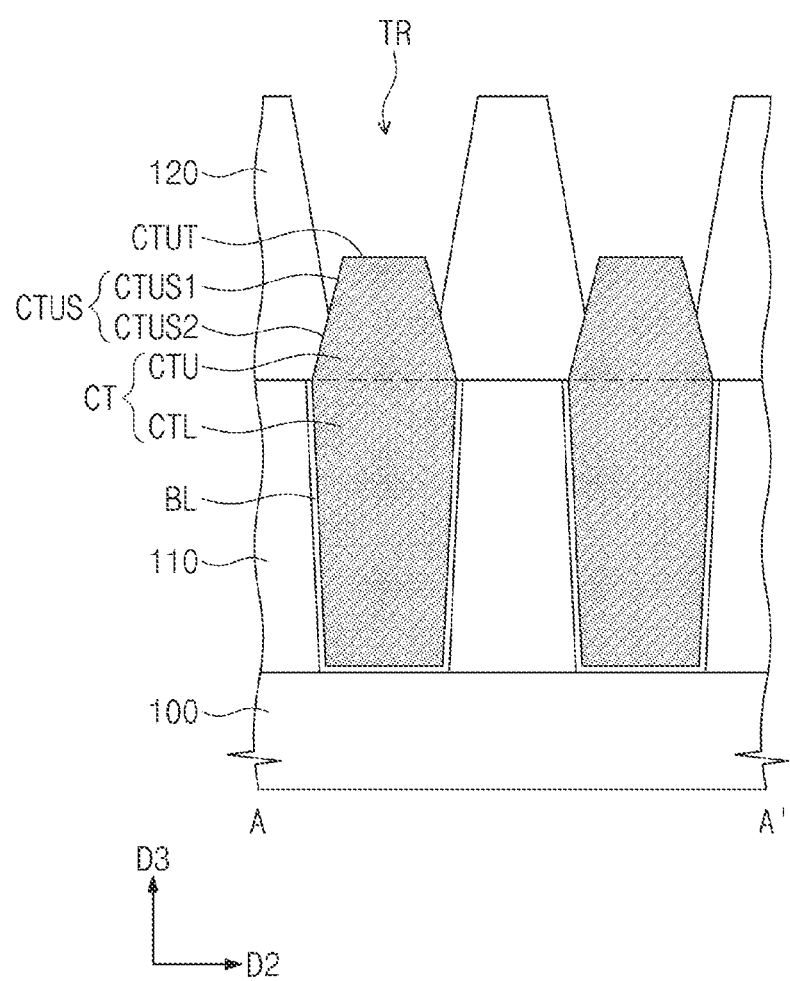
Figure 4C:
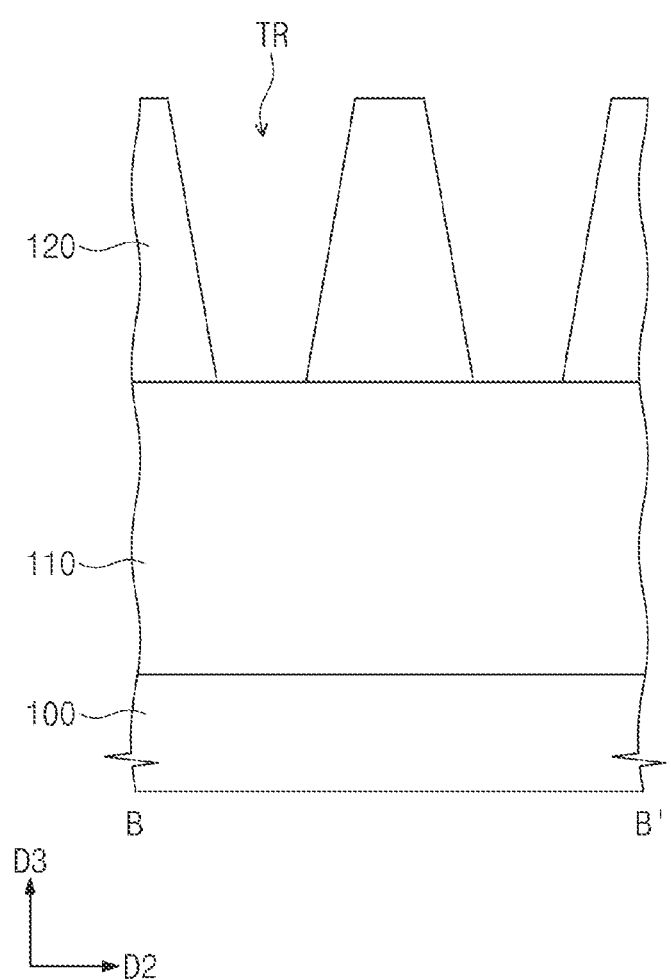
FIG. 4C illustrates a cross-sectional view taken along line B-B' of FIG. 4A.
Figure 4D:
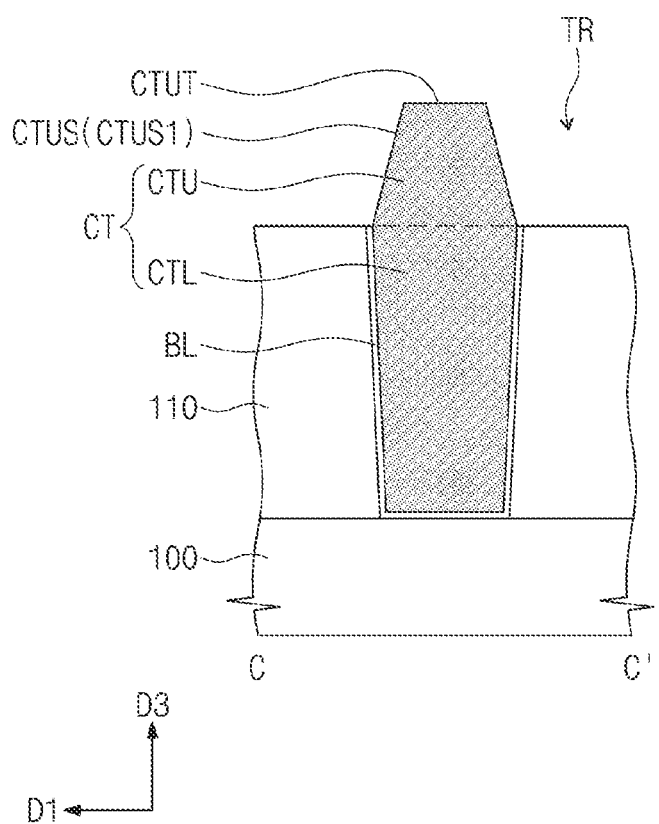
FIG. 4D illustrates a cross-sectional view taken along line C-C' of FIG. 4A.

FIGS. 2A, 3A, and 4A illustrate plan views showing a method of fabricating a semiconductor device, according to some example embodiments of the present inventive concepts. FIGS. 2B, 3B, and 4B illustrate cross-sectional views taken along line A-A' of FIGS. 2A, 3A, and 4A, respectively. FIG. 4C illustrates a cross-sectional view taken along line B-B' of FIG. 4A. FIG. 4D illustrates a cross-sectional view taken along line C-C' of FIG. 4A.

Referring to FIGS. 2A and 2B, a first dielectric layer 110 and a third dielectric layer 130 may be sequentially formed on a substrate 100. The first dielectric layer 110 may include a silicon oxide layer or a silicon oxynitride layer. The third dielectric layer 130 may include a material having an etch selectivity with respect to the first dielectric layer 110. For example, the third dielectric layer 130 may include tetraethylorthosilicate (TEOS).

Barrier layers BL and contacts CT may be formed in the first and third dielectric layers 110 and 130. The contacts CT may extend in a third direction D3 and penetrate the first and third dielectric layers 110 and 130. Each of the contacts CT may include a lower segment CTL provided in the first dielectric layer 110 and an upper segment CTU disposed on the lower segment CTL. The upper segment CTU may be provided in the third dielectric layer 130. The barrier layers BL may conformally cover bottom surfaces and sidewalls of the contacts CT.

The formation of the barrier layers BL and the contacts CT may include patterning the first and third dielectric layers 110 and 130, conformally forming a barrier material layer on an entire surface of the substrate 100, forming a contact material layer on the barrier material layer, and performing a planarization process to partially remove the barrier material layer and the contact material layer. The planarization process may continue until a top surface of the third dielectric layer 130 is exposed. The planarization process may include a chemical mechanical polishing process. The barrier material layer may include titanium nitride. The contact material layer may include a conductive material. For example, the contact material layer may include metal or doped silicon.

Referring to FIGS. 3A and 3B, a first etching process may be performed to remove the third dielectric layer 130. For example, the first etching process may simultaneously remove the third dielectric layer 130, the barrier layer BL in the third dielectric layer 130, and a portion of the upper segment CTU of the contact CT. For another example, the first etching process may be performed to remove the third dielectric layer 130, and thereafter a second etching process may be performed to remove the exposed portion of the barrier layer BL and the exposed portion of the upper segment CTU of the contact CT. The partial removal of the upper segment CTU of the contact CT may define a top surface CTUT and a third sidewall CTUS at the upper segment CTU of the contact CT. The removal of the third dielectric layer 130 may expose the upper segment CTU of the contact CT.

Referring to FIGS. 4A, 4B, 4C, and 4D, a second dielectric layer 120 may be formed on the first dielectric layer 110. The second dielectric layer 120 may cover the upper segment CTU of the contact CT. The second dielectric layer 120 may include a material having an etch selectivity with respect to the first dielectric layer 110. For example, the second dielectric layer 120 may include tetraethylorthosilicate (TEOS).

The second dielectric layer 120 may be patterned to form trenches TR in the second dielectric layer 120. The trenches TR may extend in a first direction D1. The trenches TR may be spaced apart from each other in a second direction D2. For example, the trenches TR may be arranged in the second direction D2. The trench TR may have a width in the second direction D2, which width may decrease with decreasing distance from the substrate 100. The trench TR may have sidewalls each of which has a slope relative to a top surface of the substrate 100.

The trench TR may expose the top surface CTUT of the upper segment CTU of the contact CT. The third sidewall CTUS of the upper segment CTU of the contact CT may have a first part CTUS1 exposed to the trench TR.

Referring back to FIGS. 1A, 1B, 1C, and 1D, conductive lines ML may be formed to fill the trenches TR. The conductive line ML may cover the top surface CTUT of the upper segment CTU of the contact CT. The conductive line ML may cover the first part CTUS1 of the third sidewall CTUS of the upper segment CTU of the contact CT.

The formation of the conductive lines ML may include forming a conductive material layer on the entire surface of the substrate 100 and performing a planarization process to partially remove the conductive material layer. The planarization process may continue until a top surface of the second dielectric layer 120 is exposed. The planarization process may include a chemical mechanical polishing process. The conductive material layer may include copper or aluminum.

Figure 5A:
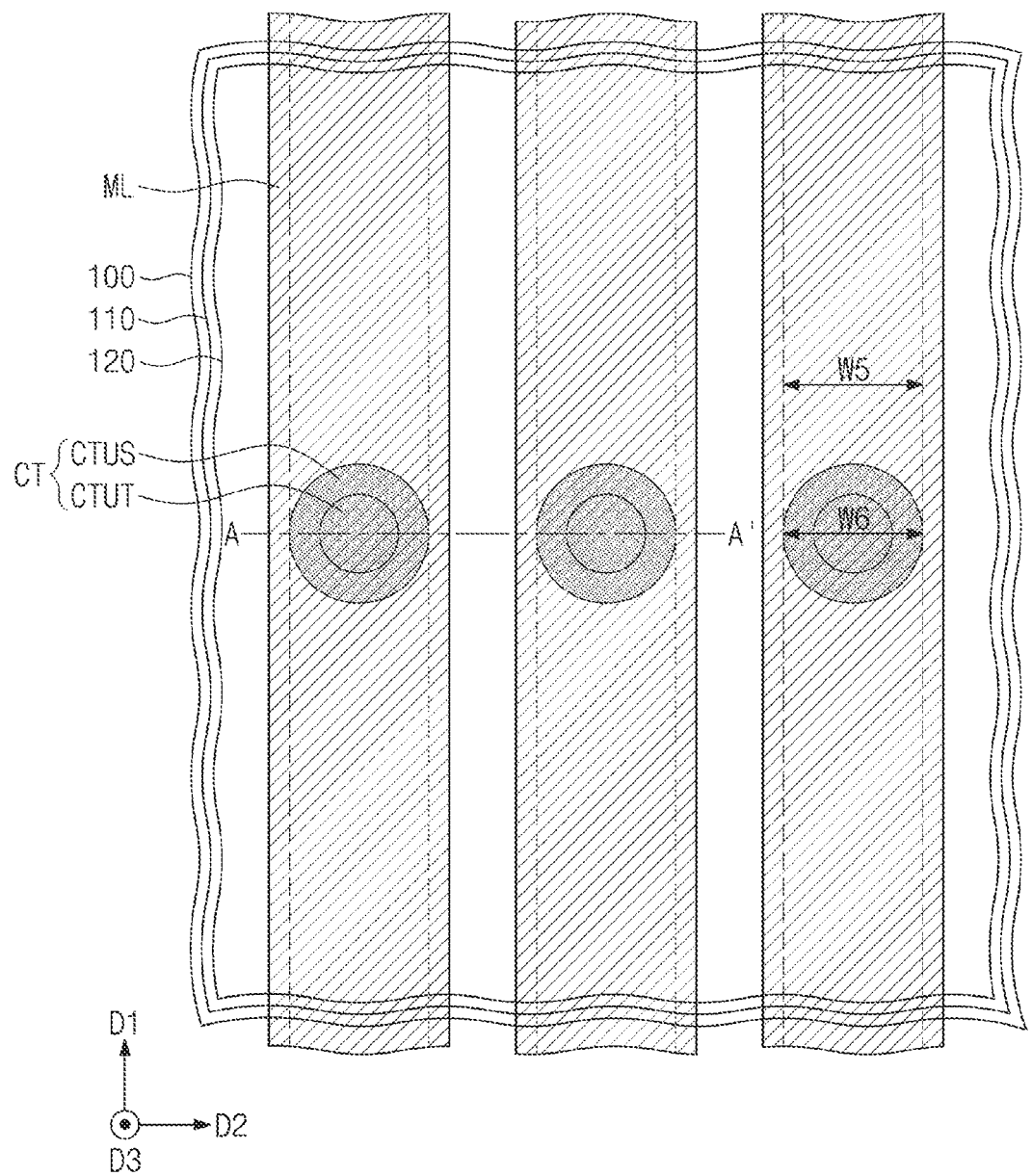
FIG. 5A illustrates a plan view showing a semiconductor device according to some example embodiments of the present inventive concepts.
Figure 5B:
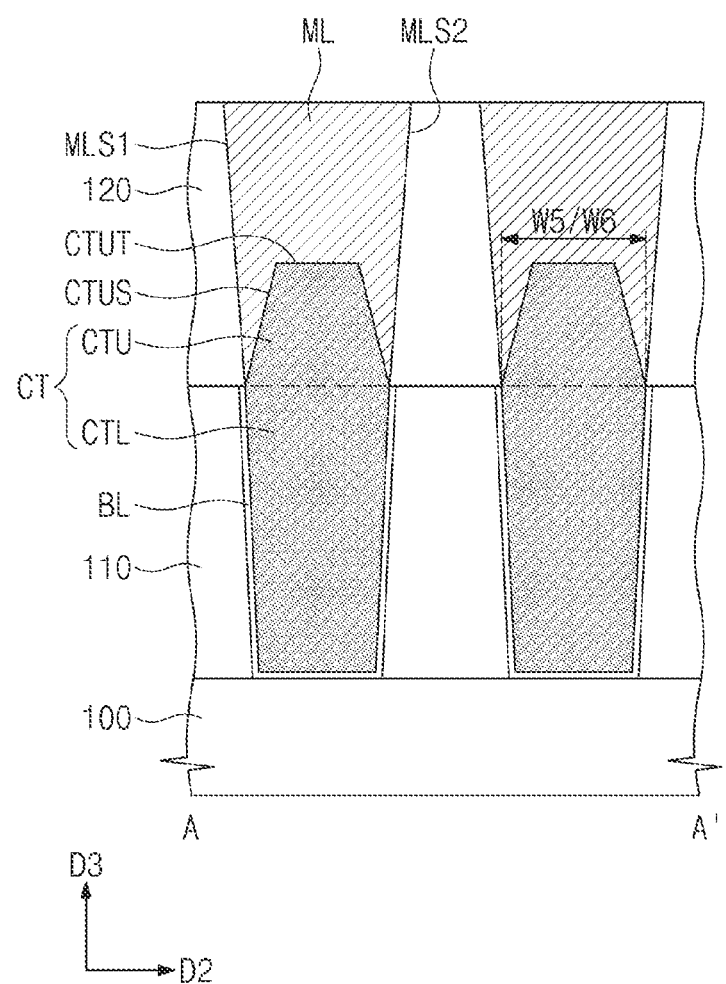
FIG. 5B illustrates a cross-sectional view taken along line A-A' of FIG. 5A.

FIG. 5A illustrates a plan view showing a semiconductor device according to some example embodiments of the present inventive concepts. FIG. 5B illustrates a cross-sectional view taken along line A-A' of FIG. 5A. In the embodiment that follows, a detailed description of technical features repetitive to those discussed above with reference to FIGS. 1A, 1B, 1C, and 1D will be omitted, and a difference thereof will be discussed in detail.

Referring to FIGS. 5A and 5B, the conductive line ML may completely cover the third sidewall CTUS of the upper segment CTU of the contact CT. For example, the third sidewall CTUS may not be in contact with the second dielectric layer 120. The conductive line ML may separate the third sidewall CTUS and the second dielectric layer 120 from each other.

The conductive line ML may have a minimum width, or a fifth width W5, in the second direction D2. The upper segment CTU of the contact CT may have a maximum width, or a sixth width W6, in the second direction D2. The fifth and sixth widths W5 and W6 may be substantially the same.

FIG. 6 illustrates a cross-sectional view showing a semiconductor device according to some example embodiments of the present inventive concepts. In the embodiment that follows, a detailed description of technical features repetitive to those discussed above with reference to FIGS. 1A, 1B, 1C, and 1D will be omitted, and a difference thereof will be discussed in detail.

Referring to FIG. 6, a substrate 100 may be provided to include a first region RG1 and a second region RG2. The first region RG1 may be a memory cell zone on which DRAM devices are disposed. The second region RG2 may be a peripheral circuit zone or a core zone.

A device isolation layer ST may be provided on the substrate 100. The device isolation layer ST may separate the first and second regions RG1 and RG2 from each other. The device isolation layer ST may define a first active section ACT1 on the first region RG1 of the substrate 100, and also define a second active section ACT2 on the second region RG2 of the substrate 100. The device isolation layer ST may include, for example, a silicon oxide layer, a silicon nitride layer, or a silicon oxynitride layer.

The first region RG1 of the substrate 100 may be provided thereon with first gate lines GL1 running across the first active section ACT1. The first gate lines GL1 may extend in a first direction D1 and may be arranged along a second direction D2. The first gate lines GL1 may be embedded in the first region RG1 of the substrate 100. The first gate lines GL1 may include a conductive material. For example, the conductive material may include one or more of doped semiconductor (doped silicon, doped germanium, and the like), conductive metal nitride (titanium nitride, tantalum nitride, and the like), metal (tungsten, titanium, tantalum, and the like), and metal-semiconductor compound (tungsten silicide, cobalt silicide, titanium silicide, and the like).

A first gate dielectric pattern GI1 may be interposed between the first active section ACT1 and each of the first gate lines GL1. For example, the first gate dielectric pattern GI1 may include a silicon oxide layer, a silicon nitride layer, or a silicon oxynitride layer.

A first capping pattern CP1 may be provided on a top surface of each of the first gate lines GL1. The first capping pattern CP1 may include, for example, a silicon nitride layer or a silicon oxynitride layer.

The first active section ACT1 may be provided therein with a first impurity region SD1 and a pair of second impurity regions SD2. The pair of second impurity regions SD2 may be spaced apart in the second direction D2 from each other across the first impurity region SD1.

The first impurity region SD1 may be provided in the first active section ACT1 between a pair of neighboring first gate lines GL1. The second impurity regions SD2 may be disposed in the first active section ACT1 on opposite sides of a pair of neighboring first gate lines GL1. The second impurity regions SD2 may be spaced apart in the second direction D2 from each other across a pair of neighboring first gate lines GL1. The first impurity region SD1 may have substantially the same conductive type as that of the second impurity regions SD2.

The first region RG1 of the substrate 100 may be provided thereon with a first dielectric layer 110 covering the first active section ACT1. The first dielectric layer 110 may include a silicon oxide layer or a silicon oxynitride layer.

A bit line BT may be provided in the first dielectric layer 110. The bit line BT may extend in the first direction D1. The bit line BT may be electrically connected to the first impurity region SD1. For example, the bit line BT may include one of doped semiconductor, conductive metal nitride, metal, and metal-semiconductor compound. A second capping pattern CP2 may be provided on the bit line BT. For example, the second capping pattern CP2 may include a silicon nitride layer or a silicon oxynitride layer.

The first dielectric layer 110 may be provided therein with first contacts CT1 and landing pads LP. The landing pads LP may be disposed on corresponding first contacts CT1. The first contacts CT1 may be electrically connected to corresponding second impurity regions SD2. The first contacts CT1 and the landing pads LP may include a conductive material such as metal or doped silicon.

A capacitor CAP may be disposed on the first dielectric layer 110. The capacitor CAP may include first electrodes LEL1, a second electrode LEL2, and a dielectric layer DIL between the second electrode LEL2 and the first electrodes LEL1. The first electrodes LEL1 may be disposed on corresponding landing pads LP. Each of the first electrodes LEL1 may be electrically connected to the second impurity region SD2 through the landing pad LP and the first contact CT1.

Each of the first electrodes LEL1 may have a cylindrical shape (or a cup shape) including a floor segment and a sidewall segment that vertically extends from the floor segment. The floor segment and the sidewall segment of each of the first electrodes LEL1 may have substantially the same thickness.

The first electrodes LEL1 may include one of doped semiconductor, conductive metal nitride, metal, and metal-semiconductor compound. For example, the first electrodes LEL1 may include metal nitride layer such as a titanium nitride (TiN) layer, a titanium silicon nitride (TiSiN) layer, a titanium aluminum nitride (TiAlN) layer, a tantalum nitride (TaN) layer, tantalum silicon nitride (TaSiN) layer, tantalum aluminum nitride (TaAlN) layer, and a tungsten nitride (WN) layer.

The dielectric layer DIL may be provided to have a uniform thickness on surfaces of the first electrodes LEL1. For example, the dielectric layer DIL may include a high-k dielectric material such as $HfO_2$, $ZrO_2$, $Al_2O_3$, $La_2O_3$, $Ta_2O_3$, and $TiO_2$.

The second electrode LEL2 may be provided on the dielectric layer DIL. The second electrode LEL2 may cover the first electrodes LEL1 with the dielectric layer DIL between the second electrode LEL2 and the first electrodes LEL1. The second electrode LEL2 may have a portion that fills a cylindrically-shaped (or cup-shaped) inside of the first electrode LEL1. The second electrode LEL2 may include one of doped semiconductor, conductive metal nitride, metal, and metal-semiconductor compound. For example, the second electrode LEL2 may have a structure where a metal nitride layer and a semiconductor layer are sequentially stacked.

A second dielectric layer 120 and a third dielectric layer 130 may be sequentially stacked on the capacitor CAP. The second dielectric layer 120 may include a silicon oxide layer or a silicon oxynitride layer. The third dielectric layer 130 may include a material having an etch selectivity with respect to the second dielectric layer 120. For example, the third dielectric layer 130 may include tetraethylorthosilicate (TEOS).

A second contact CT2 may be provided to penetrate the second dielectric layer 120 and to have electrical connection with the second electrode LEL2. A first conductive line ML1 may be provided in the third dielectric layer 130. The first conductive line ML1 may extend in the first direction D1. The first conductive line ML1 may be electrically connected through the second contact CT2 to the capacitor CAP. The first conductive line ML1 may have a width in the second direction D2, which width may decrease with decreasing distance from the substrate 100.

The second contact CT2 may include a lower segment CT2L provided in the second dielectric layer 120 and an upper segment CT2U disposed on the lower segment CT2L. The upper segment CT2U may be provided in the third dielectric layer 130. The upper segment CT2U may have a width in the second direction D2, which width may increase with decreasing distance from the substrate 100. The upper segment CT2U may have a top surface that is covered with the first conductive line ML1. The upper segment CT2U may have a sidewall that is partially covered with the first conductive line ML1.

The second region RG2 of the substrate 100 may be provided thereon with a second gate line GL2 running across the second active section ACT2. The second gate line GL2 may extend in the first direction D1. The second gate line GL2 may include a conductive material. For example, the conductive material may include one or more of doped semiconductor (doped silicon, doped germanium, and the like), conductive metal nitride (titanium nitride, tantalum nitride, and the like), metal (tungsten, titanium, tantalum, and the like), and metal-semiconductor compound (tungsten silicide, cobalt silicide, titanium silicide, and the like).

A second gate dielectric pattern GI2 may be interposed between the second active section ACT2 and the second gate line GL2. For example, the second gate dielectric pattern GI2 may include a silicon oxide layer, a silicon nitride layer, or a silicon oxynitride layer.

Gate spacers GS may be provided on opposite sidewalls of the second gate line GL2. The gate spacers GS may be spaced apart in the second direction D2 from each other across the second gate line GL2. The gate spacers GS may include a silicon oxide layer, a silicon nitride layer, or a silicon oxynitride layer.

A third capping pattern CP3 may be provided on a top surface of the second gate line GL2. For example, the third capping pattern CP3 may include a silicon nitride layer or a silicon oxynitride layer.

A pair of third impurity regions SD3 may be provided in the second active section ACT2. The pair of third impurity regions SD3 may be spaced apart in the second direction D2 from each other across the second gate line GL2. The third impurity regions SD3 may have substantially the same conductive type as each other.

The first dielectric layer 110, the second dielectric layer 120, and the third dielectric layer 130 may be sequentially stacked on the second region RG2 of the substrate 100.

A third contact CT3 may be provided to penetrate the first and second dielectric layers 110 and 120 and to have electrical connection with the third impurity region SD3. A second conductive line ML2 may be provided in the third dielectric layer 130. The second conductive line ML2 may extend in the first direction D1. The second conductive line ML2 may be electrically connected through the third contact CT3 to the third impurity region SD3. The second conductive line ML2 may have a width in the second direction D2, which width may decrease with decreasing distance from the substrate 100.

The third contact CT3 may include a lower segment CT3L provided in the first and second dielectric layers 110 and 120 and an upper segment CT3U disposed on the lower segment CT3L. The upper segment CT3U may be provided in the third dielectric layer 130. The upper segment CT3U may have a width in the second direction D2, which width may increase with decreasing distance from the substrate 100. The upper segment CT3U may have a top surface that is covered with the second conductive line ML2. The upper segment CT3U may have a sidewall that is partially covered with the second conductive line ML2.

According to the present inventive concepts, the sidewall of the upper segment of the contact may be in contact with the conductive line, which may result in an improvement of interface resistance characteristics between the contact and the conductive line.

Although the present invention has been described in connection with some example embodiments of the present inventive concepts illustrated in the accompanying drawings, it will be understood to those skilled in the art that various changes and modifications may be made without departing from the technical spirit and essential feature of the present inventive concepts. It will be apparent to those skilled in the art that various substitution, modifications, and changes may be thereto without departing from the scope and spirit of the present inventive concepts.

What is claimed:

1. A semiconductor device, comprising:
   a substrate;
   a first dielectric layer and a second dielectric layer that are sequentially stacked on the substrate;
   a contact that penetrates the first dielectric layer and extends toward the substrate; and
   a conductive line in the second dielectric layer and electrically connected to the contact, the conductive line extending in a first direction,
   wherein the contact comprises a lower segment in the first dielectric layer and an upper segment in the second dielectric layer,
   wherein the conductive line comprises a recess in a lowest surface thereof that is recessed in a direction away from the substrate,
   wherein the upper segment of the contact is in contact with the recess, and
   wherein a minimum width in a second direction of the conductive line is less than or substantially equal to a maximum width in the second direction of the upper segment of the contact, the second direction intersecting the first direction.

2. The semiconductor device of claim 1, wherein the conductive line completely covers a sidewall of the upper segment of the contact.

3. The semiconductor device of claim 2, wherein a width of the conductive line in the second direction decreases with decreasing distance from the substrate.

4. The semiconductor device of claim 3, where a width of the upper segment of the contact in the second direction increases with decreasing distance from the substrate.

5. The semiconductor device of claim 1, wherein opposing sidewalls of the upper segment of the contact are tapered inward toward each other relative to the substrate and opposing sidewalls of the conductive line are tapered outward away from each other relative to the substrate to define an hour glass shaped cross section at a boundary where the opposing sidewalls of the upper segment of the contact meet the opposing sidewalls of the conductive line.

6. A semiconductor device, comprising:
   a substrate;
   a first dielectric layer and a second dielectric layer that are sequentially stacked on the substrate;
   a contact that penetrates the first dielectric layer and extends toward the substrate, the contact including a lower segment in the first dielectric layer and an upper segment in the second dielectric layer;
   a conductive line extending in a first direction in the second dielectric layer and electrically connected to the contact; and
   a barrier layer disposed between the first dielectric layer and the lower segment of the contact,
   wherein a sidewall of the upper segment of the contact is in direct contact with the second dielectric layer, and
   wherein a minimum width in a second direction of the conductive line is less than or substantially equal to a maximum width in the second direction of the upper segment of the contact, the second direction intersecting the first direction.

7. The semiconductor device of claim 6, wherein the sidewall of the upper segment of the contact comprises a first part in contact with the conductive line and a second part in contact with the second dielectric layer.

8. The semiconductor device of claim 6, wherein the conductive line completely covers the sidewall of the upper segment of the contact.

9. The semiconductor device of claim 6, wherein a width of the upper segment of the contact in the second direction increases with decreasing distance from the substrate.

10. The semiconductor device of claim 6, wherein, when viewed in plan, a top surface of the upper segment of the contact is surrounded by the sidewall of the upper segment of the contact.

11. The semiconductor device of claim 6, wherein a width of the lower segment of the contact in the second direction decreases with decreasing distance from the substrate.

* * * * *